US010978997B2

(12) United States Patent
Khlat

(10) Patent No.: US 10,978,997 B2
(45) Date of Patent: Apr. 13, 2021

(54) ENVELOPE TRACKING INTEGRATED CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 37 days.

(21) Appl. No.: 16/549,062

(22) Filed: Aug. 23, 2019

(65) Prior Publication Data
US 2020/0274494 A1 Aug. 27, 2020

Related U.S. Application Data
(60) Provisional application No. 62/810,436, filed on Feb. 26, 2019.

(51) Int. Cl.
*H03F 1/02* (2006.01)
*H03F 3/213* (2006.01)
*H03G 3/20* (2006.01)
*H04B 1/40* (2015.01)
*H04W 84/04* (2009.01)

(52) U.S. Cl.
CPC .............. *H03F 1/02* (2013.01); *H03F 3/213* (2013.01); *H03F 2200/102* (2013.01); *H03F 2200/451* (2013.01); *H04B 1/40* (2013.01); *H04W 84/042* (2013.01)

(58) Field of Classification Search
CPC ...... H03F 1/02; H03F 3/213; H03F 2200/451; H03F 2200/102; H03F 3/68; H03F 3/19; H03F 1/0227; H03F 3/245; H04B 1/40; H04B 1/0483; H04W 84/042

USPC ............. 330/297, 127, 136, 134, 295, 124 R
See application file for complete search history.

(56) References Cited

U.S. PATENT DOCUMENTS 8,476,976 B2 * 7/2013 Wimpenny ......... H03F 3/45076
330/127
8,718,188 B2 5/2014 Balteanu et al.
2020/0204116 A1 6/2020 Khlat

OTHER PUBLICATIONS

Non-Final Office Action for U.S. Appl. No. 16/514,051, dated Nov. 13, 2020, 9 pages.

* cited by examiner

*Primary Examiner* — Hieu P Nguyen
(74) *Attorney, Agent, or Firm* — Withrow & Terranova, P.L.L.C.

(57) ABSTRACT

An envelope tracking (ET) integrated circuit (IC) (ETIC) is provided. The ETIC includes a number of ET circuits configured to generate a number of ET voltages based on a number of ET target voltages, respectively. In examples discussed herein, a selected ET circuit among the ET circuits is configured to generate a respective ET voltage based on a maximum ET target voltage among the ET target voltages. In this regard, the respective ET voltage generated by the selected ET circuit can be used as a reference ET voltage for the rest of the ET circuits in the ETIC. As a result, it may be possible to opportunistically turn off or reduce functionality of one or more other ET circuits in the ETIC, thus helping to reduce peak battery current and improve heat dissipation in an ET amplifier apparatus incorporating the ETIC.

20 Claims, 2 Drawing Sheets

US 10,978,997 B2

ENVELOPE TRACKING INTEGRATED CIRCUIT AND RELATED APPARATUS

RELATED APPLICATIONS

Figure 1:
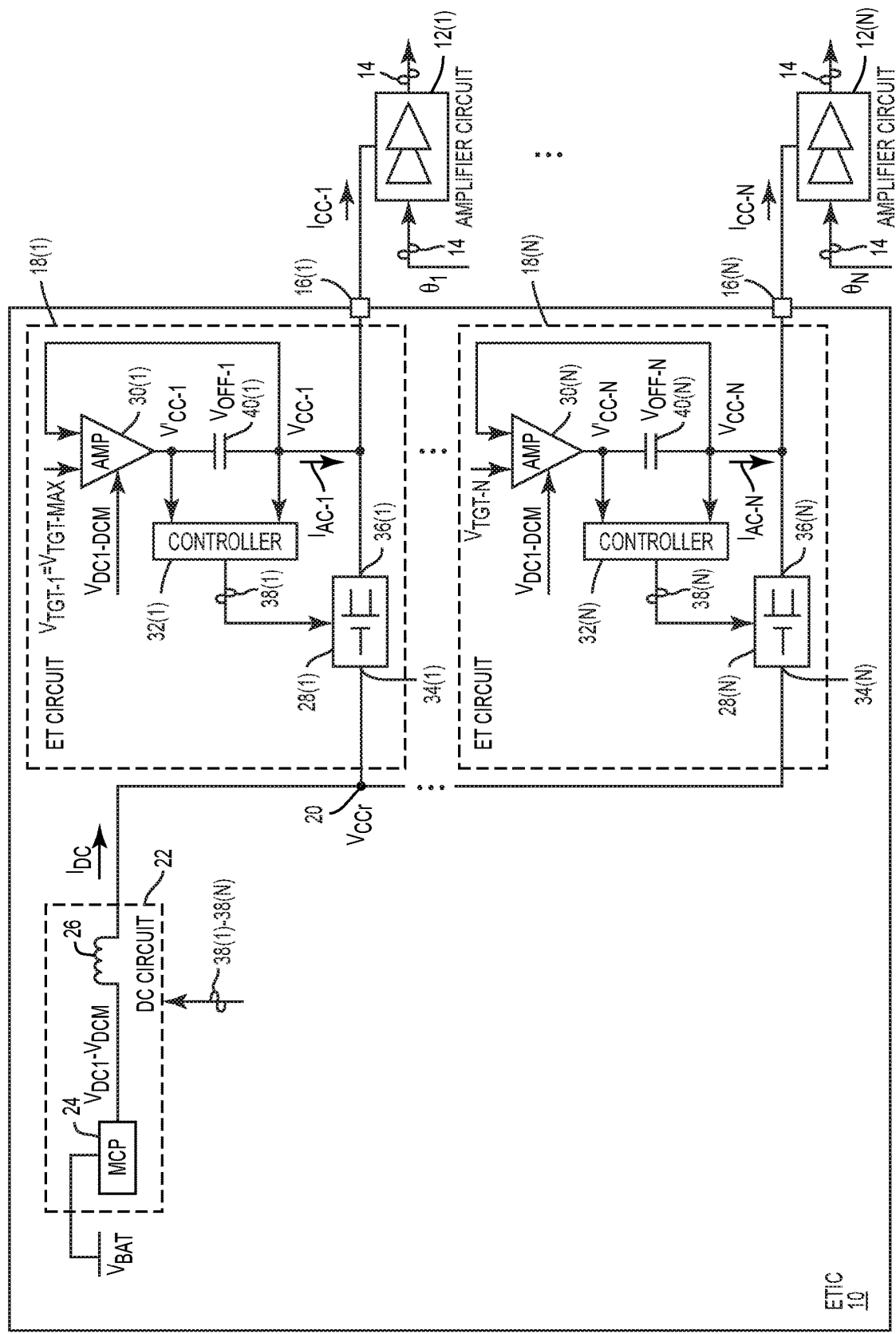

This application claims the benefit of provisional patent application Ser. No. 62/810,436, filed Feb. 26, 2019, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication technology has been widely regarded as the next wireless communication standard beyond the current third-generation (3G) communication standard, such as wideband code division multiple access (WCDMA), and fourth-generation (4G) communication standard, such as long-term evolution (LTE). As such, a 5G-NR capable mobile communication device is expected to achieve significantly higher data rates, improved coverage range, enhanced signaling efficiency, and reduced latency compared to a conventional mobile communication device supporting only the 3G and 4G communication standards.

The 5G-NR capable mobile communication device can be configured to transmit a radio frequency (RF) signal(s) in a millimeter wave (mmWave) RF spectrum(s), such as an RF spectrum above 28 GHz. RF signals transmitted in the mmWave RF spectrum are susceptible to attenuation and interference. In this regard, the 5G-NR capable mobile communication device typically employs a power amplifier phase array and antenna array to shape the RF signal(s) into a directional RF beam(s) for transmission in the mmWave RF spectrum(s). Depending on the application scenarios supported by the 5G-NR capable mobile communication device, the power amplifier phase array may be configured to include from tens to hundreds of power amplifiers. Notably, power amplifiers in the power amplifier phase array can generate excessive heat when operating at suboptimal efficiency. As such, it may be desirable to improve operating efficiency of the power amplifier phase array to help reduce heat dissipation in the 5G-NR capable mobile communication device.

Envelope tracking (ET) is a power management technology designed to improve efficiency levels of the power amplifiers in the power amplifier phase array to help reduce power consumption and thermal dissipation in the 5G-NR capable mobile communication device. In an ET system, each of the power amplifiers is configured to amplify the RF signal(s) based on a time-variant ET voltage generated in accordance with a time-variant power envelope of the RF signal(s). The time-variant ET voltage increases as the time-variant power envelope rises and decreases as the time-variant power envelope falls. Understandably, the better the time-variant ET voltage tracks the time-variant power envelope, the higher efficiency can be achieved in the power amplifiers. In this regard, it may be desirable to enable ET in the 5G-NR capable mobile communication device to help improve the efficiency levels of the power amplifiers in the power amplifier phase array.

SUMMARY

Embodiments of the disclosure relate to an envelope tracking (ET) integrated circuit (IC) (ETIC) and related ET amplifier apparatus. The ETIC includes a number of ET circuits coupled to a number of amplifier circuits configured to amplify a radio frequency (RF) signal based on a number of ET voltages, respectively. The ET circuits are configured to generate the ET voltages based on a number of ET target voltages, respectively. In examples discussed herein, a selected ET circuit among the ET circuits is configured to generate a respective ET voltage based on a maximum ET target voltage among the ET target voltages. In this regard, the respective ET voltage generated by the selected ET circuit can be used as a reference ET voltage for the rest of the ET circuits in the ETIC. As a result, it may be possible to opportunistically turn off or reduce functionality of one or more other ET circuits in the ETIC, thus helping to reduce peak battery current and improve heat dissipation in an ET amplifier apparatus incorporating the ETIC.

In one aspect, an ETIC is provided. The ETIC includes a number of amplifier ports coupled to a number of amplifier circuits configured to amplify an RF signal based on a number of ET voltages, respectively. The ETIC also includes a number of ET circuits coupled between a common port and the amplifier ports, respectively. The ET circuits are configured to generate the ET voltages based on a number of ET target voltages, respectively. The ET voltages are provided to the amplifier ports, respectively. A selected ET circuit among the ET circuits is configured to receive a maximum ET target voltage among the ET target voltages. The selected ET circuit is also configured to generate a reference ET voltage among the ET voltages based on the maximum ET target voltage. The reference ET voltage is provided to the common port and a selected amplifier port coupled to the selected ET circuit.

In another aspect, an ET amplifier apparatus is provided. The ET amplifier apparatus includes a number of amplifier circuits configured to amplify an RF signal based on a number of ET voltages, respectively. The ET amplifier apparatus also includes an ETIC. The ETIC includes a number of amplifier ports coupled to the amplifier circuits, respectively. The ETIC also includes a number of ET circuits coupled between a common port and the amplifier ports, respectively. The ET circuits are configured to generate the ET voltages based on a number of ET target voltages, respectively. The ET voltages are provided to the amplifier ports, respectively. A selected ET circuit among the ET circuits is configured to receive a maximum ET target voltage among the ET target voltages. The selected ET circuit among the ET circuits is also configured to generate a reference ET voltage among the ET voltages based on the maximum ET target voltage. The reference ET voltage is provided to the common port and a selected amplifier port coupled to the selected ET circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
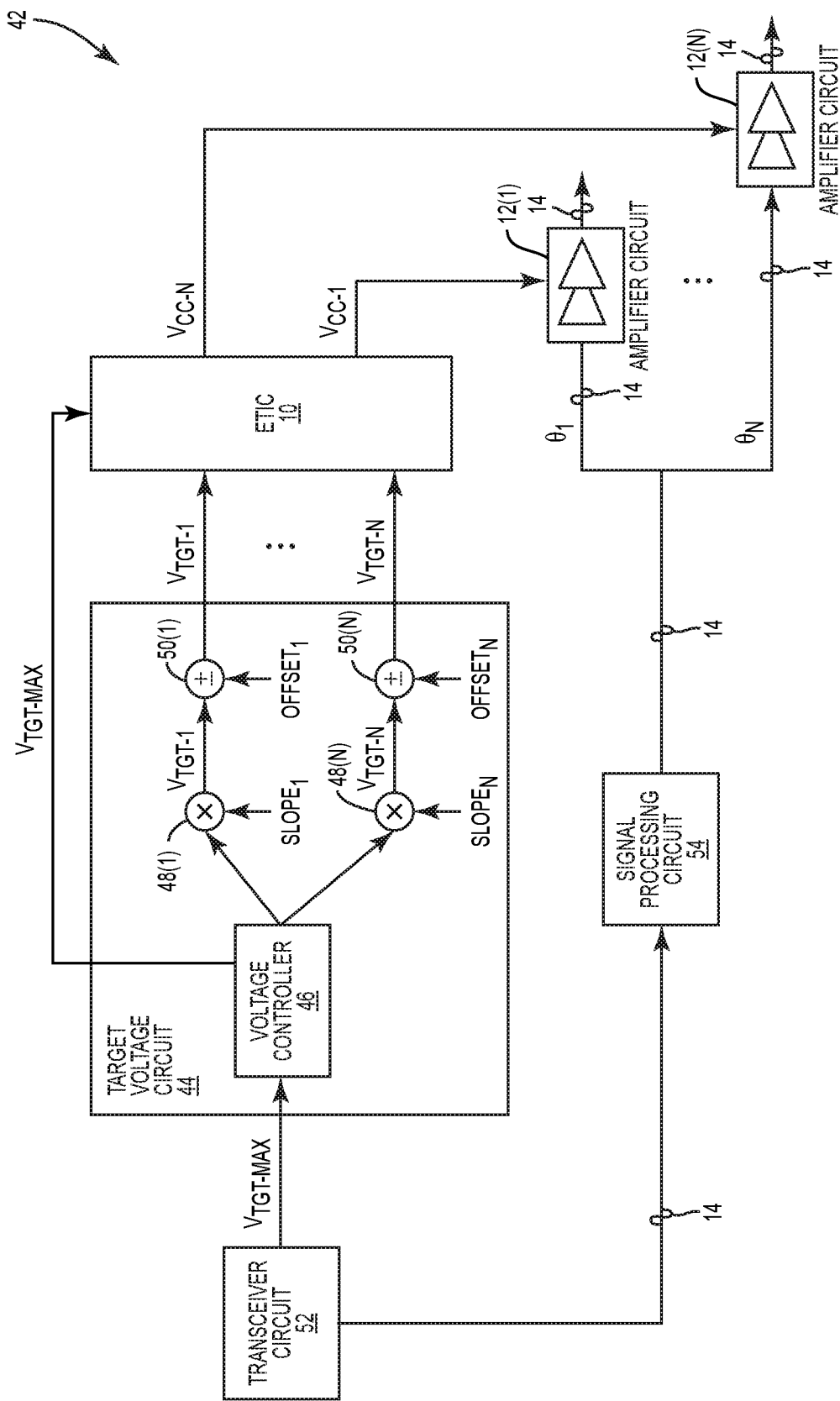

FIG. 1 is a schematic diagram of an exemplary envelope tracking (ET) integrated circuit (IC) (ETIC) configured according to an embodiment of the present disclosure to provide a number of ET voltages to a number of amplifier circuits for amplifying a radio frequency (RF) signal; and FIG. 2 is a schematic diagram of an exemplary ET amplifier apparatus incorporating the ETIC of FIG. 1.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) integrated circuit (IC) (ETIC) and related ET amplifier apparatus. The ETIC includes a number of ET circuits coupled to a number of amplifier circuits configured to amplify a radio frequency (RF) signal based on a number of ET voltages, respectively. The ET circuits are configured to generate the ET voltages based on a number of ET target voltages, respectively. In examples discussed herein, a selected ET circuit among the ET circuits is configured to generate a respective ET voltage based on a maximum ET target voltage among the ET target voltages. In this regard, the respective ET voltage generated by the selected ET circuit can be used as a reference ET voltage for the rest of the ET circuits in the ETIC. As a result, it may be possible to opportunistically turn off or reduce functionality of one or more other ET circuits in the ETIC, thus helping to reduce peak battery current and improve heat dissipation in an ET amplifier apparatus incorporating the ETIC.

In this regard, FIG. 1 is a schematic diagram of an exemplary ETIC 10 configured according to an embodiment of the present disclosure to provide a number of ET voltages $V_{CC-1}$-$V_{CC-N}$ to a number of amplifier circuits 12(1)-12(N) for amplifying an RF signal 14. The ETIC 10 is coupled to the amplifier circuits 12(1)-12(N) via a number of amplifier ports 16(1)-16(N), respectively. The ETIC 10 includes a number of ET circuits 18(1)-18(N) that are coupled between a common port 20 and the amplifier ports 16(1)-16(N), respectively. The ET circuits 18(1)-18(N) are configured to generate the ET voltages $V_{CC-1}$-$V_{CC-N}$ based on a number of ET target voltages $V_{TGT-1}$-$V_{TGT-N}$, respectively. In other words, the ET voltages $V_{CC-1}$-$V_{CC-N}$ are generated to rise and fall in accordance with the ET target voltages $V_{TGT-1}$-$V_{TGT-N}$, respectively. Understandably, the closer the ET voltages $V_{CC-1}$-$V_{CC-N}$ track the ET target voltages $V_{TGT-1}$-$V_{TGT-N}$, the more efficient the amplifier circuits 12(1)-12(N) will become.

In a non-limiting example, the amplifier circuits 12(1)-12(N) are configured to amplify the RF signal 14, which may have been modulated in same or different phase terms $\theta_1$-$\theta_N$, for concurrent transmission in a formed RF beam (also known as "beamforming"). In this regard, the ET circuits 18(1)-18(N) may be required to operate concurrently to provide the ET voltages $V_{CC-1}$-$V_{CC-N}$ to the amplifier circuits 12(1)-12(N), respectively. Notably, each of the ET circuits 18(1)-18(N) will draw a respective battery current while generating a respective ET voltage among the ET voltages $V_{CC-1}$-$V_{CC-N}$. As such, the ET circuits 18(1)-18(N) may cause a substantial amount of heat to potentially degrade performance of the ETIC 10.

Although the RF signal 14 may have been modulated in the phase terms $\theta_1$-$\theta_N$ prior to being amplified by the amplifier circuits 12(1)-12(N), some or all of the RF signal 14 in the phase terms $\theta_1$-$\theta_N$ can correspond to identical peak-to-peak signal amplitudes. In this regard, some or all of the ET circuits 18(1)-18(N) may generate an identical ET voltage among the ET voltages $V_{CC-1}$-$V_{CC-N}$ based on an identical ET target voltage among the ET target voltages $V_{TGT-1}$-$V_{TGT-N}$. As such, it may be possible to generate the identical ET voltage using a single ET circuit and power off some or all of the ET circuits 18(1)-18(N) to help reduce battery current drain and improve heat dissipation in the ETIC 10.

In a non-limiting example, a selected ET circuit, such as the ET circuit 18(1), is configured to receive the ET target voltage $V_{TGT-1}$ as a maximum ET target voltage $V_{TGT-MAX}$ among the ET target voltages $V_{TGT-1}$-$V_{TGT-N}$. In one non-limiting example, the maximum ET target voltage $V_{TGT-MAX}$ can be equal to a maximum of the ET target voltages $V_{TGT-1}$-$V_{TGT-N}$. In another non-limiting example, the maximum ET target voltage $V_{TGT-MAX}$ can be equal to the maximum of the ET target voltages $V_{TGT-1}$-$V_{TGT-N}$ plus a headroom voltage (e.g., 0.1 V). In other words, the maximum ET target voltage $V_{TGT-MAX}$ is greater than or equal to any of the ET target voltages $V_{TGT-1}$-$V_{TGT-N}$.

Accordingly, the ET voltage $V_{CC-1}$ generated by the selected ET circuit 18(1) can be used as a reference ET voltage $V_{CCr}$. The selected ET circuit 18(1) can be configured to provide the reference ET voltage $V_{CCr}$ directly to a selected amplifier port, such as the amplifier port 16(1), and to the common port 20. In this regard, the rest of the ET circuits 18(2)-18(N) in the ETIC 10 may receive the reference ET voltage $V_{CCr}$ via the common port 20. As discussed in detail below, the ETIC 10 may be configured to opportunistically turn off or reduce functionality of one or more of the other ET circuits 18(2)-18(N) in the ETIC 10, thus helping to reduce peak battery current and improve heat dissipation the ETIC 10.

The ETIC 10 can be configured to include a direct current (DC) circuit 22, which may include a multi-level charge pump (MCP) 24 coupled in series to an inductor 26. In a non-limiting example, the MCP 24 can be a combination of micro-inductance-based and micro-capacitance-based buck-boost circuits configured to generate a number of DC voltages $V_{DC1}$-$V_{DCM}$ based on a battery voltage $V_{BAT}$. Although the MCP 24 is capable of generating the DC voltages $V_{DC1}$-$V_{DCM}$ at different levels, the MCP 24 is configured to output only a selected DC voltage $V_{DC}$ among the DC voltages $V_{DC1}$-$V_{DCM}$ at a given time. Accordingly, the inductor 26 can generate a direct current $I_{DC}$ based on the selected DC voltage $V_{DC}$.

The ET circuits 18(1)-18(N) include a number of switching/regulating circuits 28(1)-28(N), a number of voltage amplifiers 30(1)-30(N) (denoted as "AMP"), and a number of controllers 32(1)-32(N), respectively. The switching/regulating circuits 28(1)-28(N) include a number of inputs 34(1)-34(N) and a number of outputs 36(1)-36(N), respectively. Each of the inputs 34(1)-34(N) is coupled to the common port 20 to receive the reference ET voltage $V_{CCr}$ and the direct current $I_{DC}$. The outputs 36(1)-36(N) are coupled to the amplifier ports 16(1)-16(N), respectively. The controllers 32(1)-32(N) may be configured to control the switching/regulating circuits 28(1)-28(N) to function as closed switches or regulators via a number of control signals 38(1)-38(N), respectively.

The voltage amplifiers 30(1)-30(N) are configured to generate a number of initial ET voltages $V'_{CC-1}$-$V'_{CC-N}$ based on the ET target voltages $V_{TGT-1}$-$V_{TGT-N}$, respectively. The voltage amplifiers 30(1)-30(N) may be coupled to a number of offset capacitors 40(1)-40(N), respectively. The offset capacitors 40(1)-40(N) are configured to raise the initial ET voltages $V'_{CC-1}$-$V'_{CC-N}$ by a number of offset voltages $V_{OFF-1}$-$V_{OFF-N}$ to generate the ET voltages $V_{CC-1}$-$V_{CC-N}$, respectively. The offset capacitors 40(1)-40(N) are coupled to the outputs 36(1)-36(N) to present the ET voltages $V_{CC-1}$-$V_{CC-N}$ at the outputs 36(1)-36(N), respectively. In addition, the voltage amplifiers 30(1)-30(N) may also be configured to source a number of alternating currents $I_{AC-1}$-$I_{AC-N}$ and present the alternating currents $I_{AC-1}$-$I_{AC-N}$ at the outputs 36(1)-36(N), respectively.

Since the selected ET circuit 18(1) is configured to generate the ET voltage $V_{CC-1}$ as the reference ET voltage $V_{CCr}$, the alternating current $I_{AC-1}$ sourced by the voltage amplifier 30(1) is likewise referred to as a reference alternating current $I_{ACr}$. Accordingly, the controller 32(1) in the selected ET circuit 18(1) may control the switching/regulating circuit 28(1) to operate as a closed switch between the input 34(1) and the output 36(1) to present the reference voltage $V_{CCr}$ and the reference alternating current $I_{ACr}$ at the common port 20. In addition, the controller 32(1) may be configured to determine a desired level of the direct current $I_{DC}$ based on the maximum ET target voltage $V_{TGT-MAX}$. Accordingly, the controller 32(1) may control the MCP 24 to output the selected DC voltage $V_{DC}$ to cause the inductor 26 to generate the direct current $I_{DC}$ at the desired level.

Given that the selected ET circuit 18(1) is configured to generate the ET voltage $V_{CC-1}$ and, thus, the reference ET voltage $V_{CCr}$ based on the maximum ET target voltage $V_{TGT-MAX}$ that is higher than or equal to any of the ET target voltages $V_{TGT-1}$-$V_{TGT-N}$, the reference ET voltage $V_{CCr}$ presented at the inputs 34(1)-34(N) will be higher than or equal to the ET voltages $V_{CC-1}$-$V_{CC-N}$ presented at the outputs 36(1)-36(N). As such, the switching/regulating circuits 28(1)-28(N) may prevent the direct current $I_{DC}$ and the alternating currents $I_{AC-1}$-$I_{AC-N}$ from flowing toward the DC circuit 22.

In a non-limiting example, a second selected ET circuit, such as the ET circuit 18(N) is also configured to receive the ET target voltage $V_{TGT-N}$ that is either equal to the maximum ET target voltage $V_{TGT-MAX}$ or within a defined margin from the maximum ET target voltage $V_{TGT-MAX}$. As such, the controller 32(N) may be configured to deactivate the voltage amplifier 30(N) in the second selected ET circuit 18(N) to stop providing the ET voltage $V_{CC-N}$ and the alternating current $I_{AC-N}$ to the amplifier port 16(N). Instead, the controller 32(N) may configure the switching/regulating circuit 28(N) to operate as a closed switch to couple the input 34(N) directly to the amplifier port 16(N) such that the amplifier port 16(N) can receive the reference ET voltage $V_{CCr}$, the direct current $I_{DC}$, and the reference alternating current $I_{ACr}$.

Alternatively, instead of deactivating the voltage amplifier 30(N) in the second selected ET circuit 18(N), the controller 32(N) may be configured to keep the voltage amplifier 30(N) activated to provide the ET voltage $V_{CC-N}$ to the amplifier port 16(N). The controller 32(N) may control the switching/regulating circuit 28(N) to block the reference ET voltage $V_{CCr}$. The controller 32(N) may configure the switching/regulating circuit 28(N) to operate as a regulator to regulate the direct current $I_{DC}$ and/or the reference alternating current $I_{ACr}$. For example, the controller 32(N) may configure the switching/regulating circuit 28(N) to pass one-half (½) of the reference alternating current $I_{ACr}$ and control the voltage amplifier 30(N) to supplement the other ½ of the reference alternating current $I_{ACr}$ ($I_{AC-N}$=½$I_{ACr}$).

In another non-limiting example, a second selected ET circuit, such as the ET circuit 18(N) is also configured to receive the ET target voltage $V_{TGT-N}$ that is below the maximum ET target voltage $V_{TGT-MAX}$ by more than the defined margin. In this regard, the controller 32(N) is configured to keep the voltage amplifier 30(N) activated to generate the ET voltage $V_{CC-N}$ and the alternating current $I_{AC-N}$. Accordingly, the controller 32(N) may control the switching/regulating circuit 28(N) to block the reference ET voltage $V_{CCr}$ and/or the reference alternating current $I_{ACr}$ from the amplifier port 16(N). Further, the controller 32(N) may configure the switching/regulating circuit 28(N) to operate as a regulator (e.g., a low-dropout regulator) to adjust an amount of the direct current $I_{DC}$ flowing to the amplifier port 16(N). For example, the controller 32(N) can configure the switching/regulating circuit 28(N) to adjust the amount of the direct current $I_{DC}$ flowing to the amplifier port 16(N) in accordance with the ET voltage $V_{CC-N}$.

In the event that the rest of the voltage amplifiers 30(2)-30(N) are configured to receive the ET target voltages $V_{TGT-2}$-$V_{TGT-N}$ that are either equal to the maximum ET target voltage $V_{TGT-MAX}$ or within the defined margin below the maximum ET target voltage $V_{TGT-MAX}$, the controllers 32(2)-32(N) may be configured to deactivate all of the rest of the voltage amplifiers 30(2)-30(N), respectively. In this regard, the controllers 32(2)-32(N) can configure the switching/regulating circuits 28(2)-28(N) to operate as switches to provide the reference ET voltage $V_{CCr}$, the direct current $I_{DC}$, and the reference alternating current $I_{ACr}$ to the amplifier ports 16(2)-16(N), respectively.

Alternatively, the controllers 32(2)-32(N) may also keep the voltage amplifiers 30(2)-30(N) activated to provide the ET voltages $V_{CC-2}$-$V_{CC-N}$ to the amplifier ports 16(2)-16(N), respectively. In addition, the controllers 32(2)-32(N) may configure the switching/regulating circuits 28(2)-28(N) to block the reference ET voltage $V_{CCr}$ from the amplifier ports 16(2)-16(N), respectively. Further, the controllers 32(2)-32(N) may control the switching/regulating circuits 28(2)-28(N) to regulate the direct current $I_{DC}$ and the reference alternating current $I_{ACr}$ that flow from the switching/regulating circuits 28(2)-28(N) to the amplifier ports 16(2)-16(N). Accordingly, the controllers 32(2)-32(N) may cause the voltage amplifiers 30(2)-30(N) to reduce or eliminate the alternating currents $I_{AC-2}$-$I_{AC-N}$ to help improve efficiency of the voltage amplifiers 30(2)-30(N).

The ETIC 10 may be provided in an ET amplifier apparatus to enable ET operation with improved heat dissipation. In this regard, FIG. 2 is a schematic diagram of an exemplary ET amplifier apparatus 42 incorporating the ETIC 10 of FIG. 1. Common elements between FIGS. 1 and 2 are shown therein with common element numbers and will not be re-described herein.

The ET amplifier apparatus 42 includes a target voltage circuit 44 configured to generate and provide the maximum ET target voltage $V_{TGT-MAX}$ and the ET target voltages $V_{TGT-1}$-$V_{TGT-N}$ to the ETIC 10. In a non-limiting example, the target voltage circuit 44 includes a voltage controller 46, a number of multipliers 48(1)-48(N), and a number of combiners 50(1)-50(N). The voltage controller 46 is configured to receive the maximum ET target voltage $V_{TGT-MAX}$ as an input and forward the maximum ET target voltage $V_{TGT-MAX}$ to the ETIC 10. The voltage controller 46 may be configured to provide the maximum ET target voltage $V_{TGT-MAX}$ to the multipliers 48(1)-48(N) configured to scale the maximum ET target voltage $V_{TGT-MAX}$ to generate the ET target voltages $V_{TGT-1}$-$V_{TGT-N}$ lower than or equal to the maximum ET target voltage $V_{TGT-MAX}$ based on a number of look-up tables (LUTs) corresponding to a number of slopes $SLOPE_1$-$SLOPE_N$, respectively. The combiners 50(1)-50(N) are configured to further adjust the ET target voltages $V_{TGT-1}$-$V_{TGT-N}$ based on a number of offset factors $OFFSET_1$-$OFFSET_N$, respectively. For an exemplary implementation of a target voltage circuit, such as the target voltage circuit 44, please refer to U.S. patent application Ser. No. 16/270,119, entitled "MULTI-VOLTAGE GENERATION CIRCUIT AND RELATED ENVELOPE TRACKING AMPLIFIER APPARATUS" and filed on Feb. 7, 2019.

The ET amplifier apparatus 42 may include or be coupled to a transceiver circuit 52 configured to generate the maximum ET target voltage $V_{TGT-MAX}$ and the RF signal 14. The ET amplifier apparatus 42 may also include a signal processing circuit 54 configured to modulate the RF signal 14 into the phase terms $\theta_1$-$\theta_N$ and provide the RF signal 14 in the phase terms $\theta_1$-$\theta_N$ to the amplifier circuits 12(1)-12(N), respectively.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (IC) (ETIC) comprising:
   a plurality of amplifier ports coupled to a plurality of amplifier circuits configured to amplify a radio frequency (RF) signal based on a plurality of ET voltages, respectively; and
   a plurality of ET circuits coupled between a common port and the plurality of amplifier ports, respectively, the plurality of ET circuits configured to generate the plurality of ET voltages based on a plurality of ET target voltages, respectively, wherein the plurality of ET voltages is provided to the plurality of amplifier ports, respectively;
   wherein a selected ET circuit among the plurality of ET circuits is configured to:
      receive a maximum ET target voltage among the plurality of ET target voltages; and
      generate a reference ET voltage among the plurality of ET voltages based on the maximum ET target voltage, wherein the reference ET voltage is provided to the common port and a selected amplifier port coupled to the selected ET circuit.

2. The ETIC of claim 1 further comprising:
   a multi-level charge pump (MCP) configured to generate a plurality of direct current (DC) voltages based on a battery voltage; and
   an inductor coupled to the MCP and the common port and configured to generate a direct current at the common port based on a selected DC voltage among the plurality of DC voltages.

3. The ETIC of claim 2 wherein the selected ET circuit is further configured to:
   determine a desired level of the direct current based on the maximum ET target voltage; and
   control the MCP to output the selected DC voltage to cause the inductor to generate the direct current at the desired level.

4. The ETIC of claim 3 wherein of the plurality of ET circuits comprises:
   a plurality of switching/regulating circuits coupled between the common port and the plurality of amplifier ports, respectively, the plurality of switching/regulating circuits configured to:
      receive the direct current via the common port; and
      provide the direct current to the plurality of amplifier ports, respectively;
   a plurality of voltage amplifiers coupled to the plurality of amplifier ports and configured to:
      generate the plurality of ET voltages based on the plurality of ET target voltages, respectively;
      generate a plurality of alternating currents based on the plurality of ET voltages, respectively; and
      provide the plurality of ET voltages and the plurality of alternating currents to the plurality of amplifier ports, respectively; and
   a plurality of controllers configured to control the plurality of switching/regulating circuits to regulate the direct current based on the plurality of ET voltages, respectively, prior to providing the direct current to the plurality of amplifier ports.

5. The ETIC of claim 4 wherein a respective controller in the selected ET circuit is configured to:
   determine the desired level of the direct current based on the maximum ET target voltage; and
   control the MCP to output the selected DC voltage to cause the inductor to generate the direct current at the desired level.

6. The ETIC of claim 4 wherein:
   a respective voltage amplifier in the selected ET circuit is configured to:
      receive the maximum ET target voltage among the plurality of ET target voltages;
      generate the reference ET voltage among the plurality of ET voltages based on the maximum ET target voltage;
      generate a reference alternating current among the plurality of alternating currents based on the reference ET voltage; and
      provide the reference ET voltage and the reference alternating current to the selected amplifier port coupled to the selected ET circuit; and
   a respective controller in the selected ET circuit is configured to control a respective switching/regulating circuit in the selected ET circuit to provide the reference ET voltage and the reference alternating current to the common port.

7. The ETIC of claim 6 wherein:
   a second selected ET circuit among the plurality of ET circuits is configured to generate a respective ET voltage among the plurality of ET voltages based on the maximum ET target voltage; and
   a respective controller in the second selected ET circuit is configured to:
      deactivate a respective voltage amplifier in the second selected ET circuit; and
      control a respective switching/regulating circuit in the second selected ET circuit to provide the reference ET voltage and the reference alternating current to a respective amplifier port coupled to the second selected ET circuit.

8. The ETIC of claim 6 wherein:
   a second selected ET circuit among the plurality of ET circuits is configured to generate a respective ET voltage among the plurality of ET voltages based on a respective ET target voltage lower than the maximum ET target voltage; and
   a respective controller in the second selected ET circuit is configured to control a respective switching/regulating circuit in the second selected ET circuit to block the reference ET voltage and the reference alternating current from a respective amplifier port coupled to the second selected ET circuit.

9. The ETIC of claim 8 wherein the respective controller in the second selected ET circuit is further configured to activate a respective voltage amplifier in the second selected ET circuit to generate and provide a respective ET voltage and a respective alternating current to the respective amplifier port coupled to the second selected ET circuit.

10. An envelope tracking (ET) amplifier apparatus comprising:
   a plurality of amplifier circuits configured to amplify a radio frequency (RF) signal based on a plurality of ET voltages, respectively; and
   an ET integrated circuit (ETIC) comprising:
      a plurality of amplifier ports coupled to the plurality of amplifier circuits, respectively; and
      a plurality of ET circuits coupled between a common port and the plurality of amplifier ports, respectively, the plurality of ET circuits configured to generate the plurality of ET voltages based on a plurality of ET target voltages, respectively, wherein the plurality of ET voltages is provided to the plurality of amplifier ports, respectively;
      wherein a selected ET circuit among the plurality of ET circuits is configured to:
         receive a maximum ET target voltage among the plurality of ET target voltages; and
         generate a reference ET voltage among the plurality of ET voltages based on the maximum ET target voltage, wherein the reference ET voltage is provided to the common port and a selected amplifier port coupled to the selected ET circuit.

11. The ET amplifier apparatus of claim 10 wherein the ETIC further comprises:
   a multi-level charge pump (MCP) configured to generate a plurality of direct current (DC) voltages based on a battery voltage; and
   an inductor coupled to the MCP and the common port and configured to generate a direct current at the common port based on a selected DC voltage among the plurality of DC voltages.

12. The ET amplifier apparatus of claim 11 wherein the selected ET circuit is further configured to:
   determine a desired level of the direct current based on the maximum ET target voltage; and
   control the MCP to output the selected DC voltage to cause the inductor to generate the direct current at the desired level.

13. The ET amplifier apparatus of claim 12 wherein the plurality of ET circuits comprises:
   a plurality of switching/regulating circuits coupled between the common port and the plurality of amplifier ports, respectively, the plurality of switching/regulating circuits configured to:
      receive the direct current via the common port; and
      provide the direct current to the plurality of amplifier ports, respectively;
   a plurality of voltage amplifiers coupled to the plurality of amplifier ports and configured to:

generate the plurality of ET voltages based on the plurality of ET target voltages, respectively;
generate a plurality of alternating currents based on the plurality of ET voltages, respectively; and
provide the plurality of ET voltages and the plurality of alternating currents to the plurality of amplifier ports, respectively; and
a plurality of controllers configured to control the plurality of switching/regulating circuits to regulate the direct current based on the plurality of ET voltages, respectively, prior to providing the direct current to the plurality of amplifier ports.

14. The ET amplifier apparatus of claim 13 wherein a respective controller in the selected ET circuit is configured to:
determine the desired level of the direct current based on the maximum ET target voltage; and
control the MCP to output the selected DC voltage to cause the inductor to generate the direct current at the desired level.

15. The ET amplifier apparatus of claim 13 wherein:
a respective voltage amplifier in the selected ET circuit is configured to:
receive the maximum ET target voltage among the plurality of ET target voltages;
generate the reference ET voltage among the plurality of ET voltages based on the maximum ET target voltage;
generate a reference alternating current among the plurality of alternating currents based on the reference ET voltage; and
provide the reference ET voltage and the reference alternating current to the selected amplifier port coupled to the selected ET circuit; and
a respective controller in the selected ET circuit is configured to control a respective switching/regulating circuit in the selected ET circuit to provide the reference ET voltage and the reference alternating current to the common port.

16. The ET amplifier apparatus of claim 15 wherein:
a second selected ET circuit among the plurality of ET circuits is configured to generate a respective ET voltage among the plurality of ET voltages based on the maximum ET target voltage; and
a respective controller in the second selected ET circuit is configured to:
deactivate a respective voltage amplifier in the second selected ET circuit; and
control a respective switching/regulating circuit in the second selected ET circuit to provide the reference ET voltage and the reference alternating current to a respective amplifier port coupled to the second selected ET circuit.

17. The ET amplifier apparatus of claim 15 wherein:
a second selected ET circuit among the plurality of ET circuits is configured to generate a respective ET voltage among the plurality of ET voltages based on a respective ET target voltage lower than the maximum ET target voltage; and
a respective controller in the second selected ET circuit is configured to control a respective switching/regulating circuit in the second selected ET circuit to block the reference ET voltage and the reference alternating current from a respective amplifier port coupled to the second selected ET circuit.

18. The ET amplifier apparatus of claim 17 wherein the respective controller in the second selected ET circuit is further configured to activate a respective voltage amplifier in the second selected ET circuit to generate and provide a respective ET voltage and a respective alternating current to the respective amplifier port coupled to the second selected ET circuit.

19. The ET amplifier apparatus of claim 10 further comprising a target voltage circuit configured to:
receive the maximum ET target voltage;
provide the maximum ET target voltage to the selected ET circuit;
scale the maximum ET target voltage to generate the plurality of ET target voltages to be lower than or equal to the maximum ET target voltage; and
provide the plurality of ET target voltages to the plurality of ET circuits, respectively.

20. The ET amplifier apparatus of claim 19 further comprising a transceiver circuit configured to:
generate and provide the maximum ET target voltage to the target voltage circuit;
generate the RF signal in a plurality of phase terms; and
provide the RF signal in the plurality of phase terms to the plurality of amplifier circuits, respectively, for concurrent transmission.

* * * * *